United States Patent
White et al.

(10) Patent No.: US 11,845,917 B2
(45) Date of Patent: Dec. 19, 2023

(54) COMPOSITIONS AND METHODS FOR POST-CMP CLEANING OF COBALT SUBSTRATES

(71) Applicant: ENTEGRIS, INC., Billerica, MA (US)

(72) Inventors: Daniela White, Ridgefield, CT (US); Donald Frye, Sherman, CT (US); Elizabeth Thomas, New Milford, CT (US); Jun Liu, Newtown, CT (US); Michael White, Ridgefield, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/694,426

(22) Filed: Nov. 25, 2019

(65) Prior Publication Data
US 2020/0199500 A1    Jun. 25, 2020

Related U.S. Application Data

(60) Provisional application No. 62/783,870, filed on Dec. 21, 2018.

(51) Int. Cl.
| | | |
|---|---|---|
| C09K 13/00 | (2006.01) | |
| C11D 7/32 | (2006.01) | |
| C11D 11/00 | (2006.01) | |
| C11D 7/34 | (2006.01) | |
| B08B 3/08 | (2006.01) | |
| C11D 7/06 | (2006.01) | |
| H01L 21/02 | (2006.01) | |
| C11D 7/26 | (2006.01) | |

(52) U.S. Cl.
CPC .............. *C11D 7/3218* (2013.01); *B08B 3/08* (2013.01); *C09K 13/00* (2013.01); *C11D 7/06* (2013.01); *C11D 7/265* (2013.01); *C11D 7/34* (2013.01); *C11D 11/0047* (2013.01); *H01L 21/02057* (2013.01); *H01L 21/02074* (2013.01)

(58) Field of Classification Search
CPC ... C09K 13/00; C09K 13/06; H01L 21/02057; C11D 7/3218; C11D 7/34; C11D 7/06; C11D 11/0047
USPC ................................................. 252/79.1, 79.4
See application file for complete search history.

(56) References Cited

U.S. PATENT DOCUMENTS

| | | | |
|---|---|---|---|
| 2009/0133716 A1 | 5/2009 | Lee | |
| 2010/0160200 A1* | 6/2010 | Seki | H01L 21/02071 510/175 |
| 2014/0143959 A1 | 5/2014 | Job | |
| 2015/0159124 A1* | 6/2015 | Takahashi | H01L 21/0273 510/175 |
| 2016/0060584 A1 | 3/2016 | Mizuta | |
| 2016/0201016 A1* | 7/2016 | Ivanov | C11D 7/34 510/175 |
| 2017/0037344 A1* | 2/2017 | Chang | C11D 7/5013 |
| 2017/0114305 A1 | 4/2017 | Spill | |
| 2017/0158992 A1 | 6/2017 | Ivanov | |
| 2018/0291309 A1 | 10/2018 | Frye | |
| 2019/0101830 A1* | 4/2019 | Ge | G03F 7/425 |
| 2019/0218414 A1* | 7/2019 | Kehrloesser | C08F 2/24 |

FOREIGN PATENT DOCUMENTS

| | | | |
|---|---|---|---|
| CN | 101848987 A | 9/2010 | |
| CN | 1904016 B | 10/2010 | |
| CN | 104334706 A | 2/2015 | |
| KR | 20080020762 A | 3/2008 | |
| KR | 20160018210 A | 2/2016 | |
| SG | 184735 A1 | 10/2012 | |
| TW | 201725262 A | 7/2017 | |
| WO | 0036079 W | 6/2000 | |
| WO | 2016003729 A1 | 1/2016 | |
| WO | 2016111990 A1 | 7/2016 | |
| WO | WO-2016111990 A1 * | 7/2016 | ............... B08B 3/08 |
| WO | 2017119350 A1 | 7/2017 | |
| WO | 2018043440 A1 | 3/2018 | |
| WO | 2018065571 A1 | 4/2018 | |

OTHER PUBLICATIONS

Wikipedia, "Hydroxylamine" via https://web.archive.org/web/20170128230058/https://en.wikipedia.org/wiki/Hydroxylamine; pp. 1-6 (Year: 2016).*
Wikipedia, "Diethylhydroxylamine" via https://web.archive.org/web/20160519175039/https://en.wikipedia.org/wiki/Diethylhydroxylamine ; pp. 1-3 (Year: 2016).*
Pubchem, "N, N-Diethylhydroxylamine" via https://pubchem.ncbi.nlm.nih.gov/compound/N_N-Diethylhydroxylamine; pp. 1-41; (Year: 2005).*
Wikipedia, "Butanone" via https://web.archive.org/web/20170716121934/https://en.wikipedia.org/wiki/Butanone ; pp. 1-6 (Year: 2017).*
National Library of Medicine, "N, N diethylhydroxylamine" via https://pubchem.ncbi.nlm.nih.gov/compound/N_N-Diethylhydroxylamine ; pp. 1-41 (Year: 2021).*
Wikipedia, "4-HYdroxy-TEMPO" via https://web.archive.org/web/20160731231111/https://en.wikipedia.org/wiki/4-Hydroxy-TEMPO ; pp. 1-2; (Year: 2016).*

* cited by examiner

*Primary Examiner* — Binh X Tran

(57) ABSTRACT

A cleaning composition is disclosed for cleaning residue and/or contaminants from microelectronic devices having same thereon. The composition comprises at least one complexing agent, at least one cleaning additive, at least one pH adjusting agent, water, and at least one oxylamine compound. Advantageously, the compositions show effective cleaning of cobalt-containing substrates and improved cobalt compatibility.

17 Claims, No Drawings

COMPOSITIONS AND METHODS FOR POST-CMP CLEANING OF COBALT SUBSTRATES

FIELD OF THE INVENTION

The present invention relates generally to compositions for cleaning residue and/or contaminants from microelectronic devices having same thereon, wherein the compositions have improved cobalt compatibility.

BACKGROUND

Microelectronic device wafers are used to form integrated circuits and includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is important to prepare a flat or planar microelectronic wafer surface prior to subsequent processing. Thus, it is necessary to remove and/or polish certain surfaces of a microelectronic device wafer.

Chemical mechanical polishing or planarization ("CMP") is a process in which material is removed from a surface of a microelectronic device wafer, and the surface is polished (more specifically, planarized) by coupling a physical process such as abrasion with a chemical process such as oxidation or chelation. Fundamentally, CMP involves applying a slurry, such as a combination of an abrasive in an aqueous solution containing active chemistry, to a polishing pad that buffs the surface of a microelectronic device wafer to achieve the removal, planarization, and polishing processes. The synergistic combination of physical and chemical action achieves fast, uniform removal. In the fabrication of integrated circuits, the CMP slurry should also be able to preferentially remove films that comprise complex layers of metals and other materials so that highly planar surfaces can be produced for subsequent photolithography, or patterning, etching and thin-film processing. One key to obtaining good uniformity across the wafer surface after polishing is to use a CMP slurry that has the correct removal selectivities for each of the materials present.

Most of the processing operations, including wafer substrate surface preparation, deposition, plating, etching and chemical mechanical polishing, require cleaning operations to ensure that the microelectronic device product is free of contaminants that would otherwise deleteriously affect the function of the product, or even render it useless for its intended function. Often, particles of these contaminants are smaller than 0.3 μm. If not removed, these residues can cause damage to, for example, copper lines or severely roughen copper metallization, as well as cause poor adhesion of post-CMP applied layers on the device substrate.

There is a continuing need in the industry to provide compositions and methods that affectively and selectively remove various residues from a substrate, e.g., post-CMP residue, post-etch residue, and post-ash residue, particularly as demand increases for improved device performance and for decreased device sizes and decreased device feature sizes. The compositions and methods should eliminate particles and other contaminants as well as not corrode, or otherwise damage components such as cobalt.

SUMMARY OF THE INVENTION

The present invention generally relates to a composition and process for cleaning residue and/or contaminants from microelectronic devices having said residue and contaminants thereon. The residue may include post-CMP, post-etch, and/or post-ash residue. Advantageously, the compositions described herein show improved cobalt compatibility relative to compositions previously described in the art.

In one aspect, a cleaning composition is described, said composition comprising at least one complexing agent, at least one cleaning additive, at least one pH adjusting agent, water, and at least one oxylamine compound or salt thereof. In some embodiments, the composition further comprises at least one etchant, at least one corrosion inhibitor, and/or at least one reducing agent. Preferably, the cleaning composition is substantially devoid of fluoride-containing sources, abrasive materials, and tetramethylammonium hydroxide.

In another aspect, a method of removing residue and contaminants from a microelectronic device having said residue and contaminants thereon is described, said method comprising contacting the microelectronic device with a cleaning composition for sufficient time to at least partially clean said residue and contaminants from the microelectronic device, wherein the cleaning composition comprises at least one complexing agent, at least one cleaning additive, water, at least one pH adjusting agent, and at least one oxylamine compound or salt thereof. In some embodiments, the composition further comprises at least one etchant, at least one corrosion inhibitor, and/or at least one reducing agent. Preferably, the cleaning composition is substantially devoid of fluoride-containing sources, abrasive materials, and tetramethylammonium hydroxide.

Other aspects, features and advantages will be more fully apparent from the ensuing disclosure and appended claims. It has been found that such a composition can achieve improved cobalt compatibility relative to compositions in the prior art. Such compatibility is of considerable benefit, for example in post-CMP cleaning in modern microelectronic device manufacturing processes.

DETAILED DESCRIPTION OF THE INVENTION

The present invention relates generally to compositions useful for the removal of residue and contaminants from a microelectronic device having such material(s) thereon. The compositions are particularly useful for the removal of post-CMP, post-etch or post-ash residue from cobalt-containing substrates without damaging the bulk cobalt.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

The microelectronic device may comprise cobalt-containing material. As used herein, "cobalt-containing material" and "cobalt species" includes any material comprising greater than 50 wt % elemental cobalt, based on the total weight of the material. Examples of cobalt-containing materials include, but are not limited to, pure cobalt, cobalt nitride (including cobalt nitrides comprising additional elements such as Ta or Li), CoP, CoSi, CoW, cobalt oxide, and cobalt hydroxide. It should be understood by the person skilled in the art that the chemical formula for the various cobalt oxides and nitrides can vary based on the oxidation state of the cobalt ion, wherein the common oxidation states of cobalt are −3, −1, +1, +2, +3, +4, or +5.

As used herein, "residue" corresponds to particles generated during the manufacture of a microelectronic device including, but not limited to, plasma etching, ashing, chemical mechanical polishing, wet etching, and combinations thereof.

As used herein, "contaminants" correspond to chemicals present in the CMP slurry, reaction by-products of the polishing slurry, chemicals present in the wet etching composition, reaction by products of the wet etching composition, and any other materials that are the by-products of the CMP process, the wet etching, the plasma etching or the plasma ashing process. A common contaminant includes benzotriazole, which is often present in the CMP slurry.

As defined herein, "post-etch residue" corresponds to material remaining following gas-phase plasma etching processes, e.g., BEOL dual damascene processing, or wet etching processes. The post-etch residue may be organic, organometallic, organosilicic, or inorganic in nature, for example, silicon-containing material, carbon-based organic material, and etch gas residue such as oxygen and fluorine.

As defined herein, "post-ash residue," as used herein, corresponds to material remaining following oxidative or reductive plasma ashing to remove hardened photoresist and/or bottom anti-reflective coating (BARC) materials. The post-ash residue may be organic, organometallic, organosilicic, or inorganic in nature.

As used herein, "post-CMP residue" corresponds to particles from the polishing slurry, e.g., silica-containing particles, chemicals present in the slurry, reaction by-products of the polishing slurry, carbon-rich particles, polishing pad particles, brush deloading particles, equipment materials of construction particles, metals, metal oxides, organic residues, barrier layer residues, and any other materials that are the by-products of the CMP process. As defined herein, the "metals" that are typically polished include copper, aluminum and tungsten.

As defined herein, "reaction or degradation products" include, but are not limited to, product(s) or byproduct(s) formed as a result of catalysis at a surface, oxidation, reduction, reactions with the compositional components, or that otherwise polymerize; product(s) or byproduct(s) formed as a result of a change(s) or transformation(s) in which a substance or material (e.g., molecules, compounds, etc.) combines with other substances or materials, interchanges constituents with other substances or materials, decomposes, rearranges, or is otherwise chemically and/or physically altered, including intermediate product(s) or byproduct(s) of any of the foregoing or any combination of the foregoing reaction(s), change(s) and/or transformation(s). It should be appreciated that the reaction or degradation products may have a larger or smaller molar mass than the original reactant.

As used herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, tungsten, cobalt, and nitrides and silicides of any of the foregoing metals.

As used herein, "complexing agent" includes those compounds that are understood by one skilled in the art to be complexing agents, chelating agents and/or sequestering agents. Complexing agents will chemically combine with or physically hold the metal atom and/or metal ion to be removed using the compositions described herein.

As used herein, "fluoride containing compounds" correspond to salt or acid compound comprising a fluoride ion (F−) that is ionically bonded to another atom.

"Substantially devoid" is defined herein as less than 2 wt. %, preferably less than 1 wt. %, more preferably less than 0.5 wt. %, and most preferably less than 0.1 wt. %. In one embodiment, "substantially devoid" corresponds to zero percent, indicating the composition is free of a particular component.

As used herein, "about" is intended to correspond to ±5% of the stated value.

As used herein, "suitability" for cleaning residue and contaminants from a microelectronic device having said residue and contaminants thereon corresponds to at least partial removal of said residue/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity, e.g., 231-235, and the number of particles counted. The particle reduction may be calculated using:

$$\text{Cleaning Efficacy} = \frac{\left(\begin{array}{l}\text{Number of } PreClean \text{ Objects} - \\ \text{Number of } PostClean \text{ Objects}\end{array}\right)}{\text{Number of } PreClean \text{ Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest. One skilled in the art would readily understand that the less area covered by said areas of interest post-cleaning, the more efficacious the cleaning composition. Preferably, at least 75% of the residue/contaminants are removed from the microelectronic device using the compositions described herein, more preferably at least 90%, even more preferably at least 95%, and most preferably at least 99% of the residue/contaminants are removed.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

Throughout the description and claims of this specification, the words "comprise" and "contain" and variations of the words, for example "comprising" and "comprises", mean "including but not limited to", and do not exclude other components, integers or steps. However, wherever the word "comprising" is used, an embodiment in which "comprising" is read as "consisting of" or "consisting essentially of" is also explicitly embraced.

Herein the singular encompasses the plural unless the context otherwise requires. In particular, where the indefinite article is used, the specification is to be understood as contemplating plurality as well as singularity, unless the context requires otherwise.

Preferred features of each aspect of the invention may be as described in connection with any of the other aspects. Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible.

The cleaning compositions described herein can be substantially devoid, or devoid, of fluoride-containing sources, abrasive materials, tetramethylammonium hydroxide (TMAH), and combinations thereof, prior to removal of residue material from the microelectronic device. In addition, the cleaning compositions should not solidify to form a polymeric solid, for example, photoresist. Although it is contemplated that the formulations can include at least one surfactant, it is also contemplated that the formulations be substantially devoid of surfactants, as readily understood by the person skilled in the art.

The cleaning compositions comprise, consist of, or consists essentially of at least one complexing agent, at least one cleaning additive, at least one pH adjusting agent, water, and at least one oxylamine compound or salt thereof. Preferably, the cleaning composition is an aqueous cleaning composition, comprising at least 50% water. Advantageously, the cleaning composition increase the removal of contaminants and residue (e.g., benzotriazole, slurry particles and other post-CMP residues) remaining on exposed cobalt of a microelectronic device while simultaneously lowering the corrosion rate of the exposed cobalt.

In one preferred embodiment, the cleaning composition of the present disclosure comprises, consists of, or consists essentially of at least one complexing agent, at least one cleaning additive, at least one pH adjusting agent, at least one oxylamine compound or salt thereof, and water, wherein the cleaning composition is formulated in the following weight percent ratios:

| Component | weight percent | preferred weight percent |
|---|---|---|
| complexing agent | about 0.01 wt % to about 20 wt % | about 0.1 wt % to about 10 wt % |

-continued

| Component | weight percent | preferred weight percent |
|---|---|---|
| cleaning additive | about 0.01 wt % to about 20 wt % | about 0.1 wt % to about 10 wt % |
| pH adjusting agent | about 0.1 wt % to about 10 wt % | about 1 wt % to about 5 wt % |
| oxylamine compound or salt | about 0.01 wt % to about 25 wt % | about 0.1 wt % to about 10 wt % |

Whenever concentrations for constituents are specified herein, it is to be understood that water may make up the balancing amount of the composition to 100%. The amount of water in the cleaning composition, based on the total weight of the composition, may be at least 80 wt %, preferably at least 85 wt %, and more preferably at least 90 wt %.

The cleaning composition of the present disclosure comprises at least one complexing agent (metal chelating agent, metal complexing agent, or metal sequestering agent). Complexing agents will chemically combine with or physically hold a metal atom and/or metal ion to be removed using the compositions described herein. Suitably, the composition may comprise a complexing agent component consisting of a plurality of complexing agents. Illustrative complexing agents can include species having the general formula $NR^1R^2R^3$, wherein $R^1$, $R^2$ and $R^3$ may be the same as or different from one another and are selected from the group consisting of hydrogen, straight-chain or branched $C_1$-$C_6$ alkyl (e.g., methyl, ethyl, propyl, butyl, pentyl, and hexyl) groups, straight-chain or branched $C_1$-$C_6$ hydroxyalkyl (e.g., hydroxymethyl, hydroxyethyl, hydroxypropyl, hydroxybutyl, hydroxypentyl, and hydroxyhexyl) groups, and $C_1$-$C_6$ alkyl ethers of straight chain or branched $C_1$-$C_6$ hydroxyalkyl groups as defined above. Most preferably, at least one of $R^1$, $R^2$ and $R^3$ is a straight-chain or branched $C_1$-$C_6$ hydroxyalkyl group. Examples include, without limitation, alkanolamines such as aminoethylethanolamine, N-methylaminoethanol, aminoethoxyethanol, dimethylaminoethoxyethanol, diethanolamine, N-methyldiethanolamine, monoethanolamine (MEA), triethanolamine (TEA), isopropanolamine, diisopropanolamine, aminopropyldiethanolamine, N,N-dimethylpropanolamine, N-methylpropanolamine, 1-amino-2-propanol, 2-amino-1-butanol, isobutanolamine, triethylenediamine, other C1-C8 alkanolamines and combinations thereof. When the amine includes the alkylether component, the amine may be considered an alkoxyamine, e.g., 1-methoxy-2-aminoethane.

Alternatively, or in addition to the $NR^1R^2R^3$ amine, the complexing agent may be a multi-functional amine including, but not limited to, 4-(2-hydroxyethyl)morpholine (HEM), 1,2-cyclohexanediamine-N,N,N',N'-tetraacetic acid (CDTA), ethylenediaminetetraacetic acid (EDTA), m-xylenediamine (MXDA), iminodiacetic acid (IDA), 2-(hydroxyethyl)iminodiacetic acid (HIDA), nitrilotriacetic acid, thiourea, 1,1,3,3-tetramethylurea, urea, urea derivatives, uric acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, and combinations thereof.

Alternatively, or in addition to the aforementioned complexing agents, additional complexing agents can include phosphonates (e.g., 1-hydroxyethylidene-1,1-diphosphonic acid (HEDP), 1,5,9-triazacyclododecane-N,N',N"-tris(methylenephosphonic acid) (DOTRP), 1,4,7,10-tetraazacyclododecane-N,N',N",N'"-tetrakis(methylenephosphonic acid)

(DOTP), nitrilotris(methylene)triphosphonic acid, diethylenetriaminepentakis(methylenephosphonic acid) (DETAP), aminotri(methylenephosphonic acid), bis(hexamethylene) triamine pentamethylene phosphonic acid, 1,4,7-triazacyclononane-N,N',N"-tris(methylenephosphonic acid (NOTP), hydroxyethyldiphosphonate, nitrilotris(methylene)phosphonic acid, 2-phosphono-butane-1,2,3,4-tetracarboxylic, carboxyethyl phosphonic acid, aminoethyl phosphonic acid, glyphosate, ethylene diamine tetra(methylenephosphonic acid) phenylphosphonic acid, salts thereof, and derivatives thereof) and/or carboxylic acids (e.g., oxalic acid, succinic acid, maleic acid, malic acid, malonic acid, adipic acid, phthalic acid, citric acid, sodium citrate, potassium citrate, ammonium citrate, tricarballylic acid, dimethylolpropionic acid, trimethylolpropionic acid, tartaric acid, glucuronic acid, 2-carboxypyridine) and/or sulfonic acids such as tiron (4,5-Dihydroxy-1,3-benzenedisulfonic acid disodium salt). For example, the at least one complexing agent may comprise a species selected from the group consisting of monoethanolamine, triethanolamine, sulfuric acid, citric acid and combinations thereof.

The amount of complexing agent(s) in the cleaning composition is in a range from about 0.01 wt % to about 20 wt %, based on the total weight of the cleaning composition. Preferably, the complexing agent is present in an amount of from about 0.01 wt % to about 10 wt %, based on the total weight of the cleaning composition, and, more preferably, in an amount of from about 0.01 wt % to about 5 wt %.

The cleaning composition of the present disclosure comprises at least one cleaning additive, which may include various solvents, water soluble polymers, and surfactants. Suitably, the composition may comprise a cleaning additive component consisting of a plurality of cleaning additives. Illustrative cleaning additives include, but are not limited to, 2-pyrrolidinone, 1-(2-hydroxyethyl)-2-pyrrolidinone (HEP), glycerol, 1,4-butanediol, tetramethylene sulfone (sulfolane), dimethyl sulfone, ethylene glycol, propylene glycol, dipropylene glycol, tetraglyme, diglyme, methyl isobutyl ketone, methyl ethyl ketone, acetone, isopropanol, octanol, ethanol, butanol, methanol, isophorone, a glycol ether (e.g., diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (DEGBE), triethylene glycol monobutyl ether (TEGBE), ethylene glycol monohexyl ether (EGHE), diethylene glycol monohexyl ether (DEGHE), ethylene glycol phenyl ether, diethylene glycol phenylether, hexaethylene glycol monophenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether (such as DOWANOL PnB), dipropylene glycol n-butyl ether, tripropylene glycol n-butyl ether, dipropylene glycol phenyl ether, propylene glycol phenyl ether (PPh, such as DOWANOL PPh), 4-methyl-2-pentanone, 2,4-dimethyl-3-pentanone, cyclohexanone, 5-methyl-3-heptanone, 3-pentanone, 5-hydroxy-2-pentanone, 2,5-hexanedione, 4-hydroxy-4-methyl-2-pentanone, acetone, butanone, 2-methyl-2-butanone, 3,3-dimethyl-2-butanone, 4-hydroxy-2-butanone, cyclopentanone, 2-pentanone, 3-pentanone, 1-phenylethanone, acetophenone, benzophenone, 2-hexanone, 3-hexanone, 2-heptanone, 3-heptanone, 4-heptanone, 2,6-dimethyl-4-heptanone, 2-octanone, 3-octanone, 4-octanone, dicyclohexyl ketone, 2,6-dimethylcyclohexanone, 2-acetylcyclohexanone, 2,4-pentanedione, menthone, dimethylsulfoxide (DMSO), dimethylformamide (DMF), N-methyl pyrrolidone, N-ethyl pyrrolidone, ethylene carbonate, propylene carbonate, cyrene, dimethylethyleneurea and combinations thereof.

Alternatively, or in addition, the cleaning additive may include water soluble polymers or surfactants, including, for example, methacrylic acid homopolymer and copolymers with, for example, acrylamidomethylpropane sulfonic acid and maleic acid; maleic acid/vinyl ether copolymer; poly (vinylpyrrolidone)/vinyl acetate; homopolymers such as phosphonated polyethyleneglycol oligomers, poly(acrylic acid) (PAA), poly(acrylamide), poly(vinyl acetate), poly (ethylene glycol) (PEG), poly(propylene glycol) (PPG), poly(styrene sulfonic acid), poly(vinyl sulfonic acid), poly (vinyl phosphonic acid), poly(vinyl phosphoric acid), poly (ethyleneimine), poly(propyleneimine), polyallylamine, polyethylene oxide (PEO), polyvinyl pyrrolidone (PVP), poly(vinyl alcohol), hydrophilic water soluble or dispersible polyurethanes, poly(ethylene glycol acrylate), poly(ethylene glycol methacrylate), PPG-PEG-PPG block copolymers, PEG-PPG-PEG block copolymers, and combinations thereof.

Alternatively, or in addition, the at least one cleaning additive may be a surfactants, including, but are not limited to, anionic, non-ionic, cationic and/or zwitterionic surfactants. Examples include alginic acid and salts thereof; hydroxyl or carboxyalkylcellulose; dextran sulfate and salts thereof; poly(galacturonic acid) and salts thereof; homopolymers of (meth)acrylic acid and salts thereof, maleic acid, maleic acid anhydride, styrene sulfonic acid and salts thereof, vinyl sulfonic acid and salts thereof, allyl sulfonic acid and salts thereof, acrylamidopropyl sulfonic acid and salts thereof; copolymers of (meth)acrylic acid and salts thereof, maleic acid, maleic acid anhydride, styrene sulfonic acid and salts thereof, vinyl sulfonic acid and salts thereof, allyl sulfonic acid and salts thereof, acrylamidopropyl sulfonic acid and salts thereof; chitosan; cationic starch; polylysine and salts thereof; homopolymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth) acrylate acid addition salts and quaternary salts, N,N'-dimethylaminopropyl acrylamide acid addition salts and quaternary salts, allylamine, diallylamine, vinylamine, vinyl pyridine; and co-polymers of diallyldimethyl ammonium chloride (DADMAC), diallyldimethyl ammonium bromide, diallyldimethyl ammonium sulfate, diallyldimethyl ammonium phosphates, dimethallyldimethyl ammonium chloride, diethylallyl dimethyl ammonium chloride, diallyl di(beta-hydroxyethyl) ammonium chloride, diallyl di(beta-ethoxyethyl) ammonium chloride, dimethylaminoethyl (meth)acrylate acid addition salts and quaternary salts, diethylaminoethyl (meth)acrylate acid addition salts and quaternary salts, 7-amino-3,7-dimethyloctyl (meth) acrylate acid addition salts and quaternary salts, N,N'-dimethylaminopropyl acrylamide acid addition salts and quaternary salts, allylamine, diallylamine, vinylamine, vinyl pyridine; cocodimethylcarboxymethylbetaine; lauryldimethylcarboxymethylbetaine; lauryldimethyl-alpha-carboxyethylbetaine; cetyldimethylcarboxymethylbetaine; lauryl-bis-(2-hydroxyethyl)carboxymethylbetaine; stearyl-bis-(2-hydroxypropyl) carboxymethylbetaine; oleyldimethyl-gamma-carboxypropylbetaine; lauryl-bis-(2-hydroxypropyl)alpha-carboxyethylebetaine; cocodimethylsulfopropylbetaine; stearyldimethylsulfopropylbetaine; lauryl-bis-(2-hydroxyethyl)sulfopropylbetaine; sodium dodecylsulfate (SDS); Surfynol 104, dioctyl sulfosuccinate sodium salt; sodium lauryl ether sulfate; polyethylene glycol branched-nonylphenyl ether sulfate ammonium salt; disodium 2-dodecyl-3-(2-sulfonatophenoxy); PEG25-PABA; polyethylene glycol mono-C10-16-alkyl ether sulfate sodium salt; (2-N-butoxyethoxy)acetic acid; hexadecylbenzene sulfonic acid; cetyltrimethylammonium hydroxide; dodecyltrimethylammonium hydroxide; dodecyltrimethyl ammonium chloride; cetyltrimethyl ammonium chloride; N-Alkyl-N-benzyl-N,N-dimethylammonium chloride; dodecylamine; polyoxyethylene lauryl ether; dodecenylsuccinic acid monodiethanol amide; ethylenediamine tetrakis (ethoxylate-block-propoxylate); and combinations thereof.

Particular cleaning additives include, but are not limited to, hydroxypropylcellulose, hydroxyethylcellulose, carboxymethylcellulose. sodium carboxymethylcellulose (NaCMC), sodium dodecylsulfate (SDS); ammonium dodecylsulfate, potassium dodecylsulfate, ammonium carboxymethylcellulose, potassium carboxymethylcellulose, ammonium alginate, potassium alginate, calcium alginate, Surfynol 104, polyvinylpyrrolidone (PVP), any polymer made using the N-vinyl pyrrolidone monomer, poly(vinyl alcohol), polyacrylic acid esters and analogues of polyacrylic acid esters, polyaminoacids (e.g., polyalanine, polyleucine, polyglycine, etc.), polyamidohydroxyurethanes, polylactones, polyacrylamide, Xanthan gum, chitosan, polyethylene oxide, polyvinyl alcohol, polyvinyl acetate, polyacrylic acid, polyethyleneimine, sugar alcohols such as sorbitol and xylitol, esters of anhydrosorbitols, secondary alcohol ethoxylates such as TERGITOL, and combinations thereof.

The amount of cleaning additive in the cleaning composition is in a range from about 0.01 wt % to about 20 wt %, based on the total weight of the cleaning composition. Preferably, the cleaning additive is present in an amount of from about 0.1 wt % to about 10 wt %, based on the total weight of the cleaning composition, and, more preferably, in an amount of from about 0.5 wt % to about 5 wt %.

The cleaning composition of the present disclosure comprises at least one pH adjusting agents used to raise or lower the pH of the composition to a target value. While the pH adjusting agent may include acids and/or bases, preferably the pH adjusting agent is a base and is used to raise the pH of the cleaning composition. Illustrative bases include, but are not limited to, alkali metal hydroxides (e.g., LiOH, KOH, RbOH, CsOH), alkaline earth metal hydroxides (e.g., $Be(OH)_2$, $Mg(OH)_2$, $Ca(OH)_2$, $Sr(OH)_2$, $Ba(OH)_2$), ammonium hydroxide (i.e., ammonia), and a tetraalkylammonium hydroxide compound having the formula $NR^1R^2R^3R^4OH$, wherein $R^1$, $R^2$, $R^3$ and $R^4$ may be the same as or different from one another and are selected from the group consisting of hydrogen, straight-chain or branched $C_1$-$C_6$ alkyl (e.g., methyl, ethyl, propyl, butyl, pentyl, and hexyl) groups, $C_1$-$C_6$ hydroxyalkyl (e.g., hydroxymethyl, hydroxyethyl, hydroxypropyl, hydroxybutyl, hydroxypentyl, and hydroxyhexyl) groups, and substituted or unsubstituted $C_6$-$C_{10}$ aryl groups (e.g., benzyl groups). Tetraalkylammonium hydroxides that are commercially available include tetramethylammonium hydroxide (TMAH), tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, and combinations thereof, may be used.

Alternatively or in addition, the pH adjusting agent may be a quaternary base having the formula $(PR^1R^2R^3R^4)OH$, wherein $R^1$, $R^2$, $R^3$, and $R^4$ may be the same as or different from one another and are selected from the group consisting of hydrogen, straight-chain $C_1$-$C_6$ alkyl (e.g., methyl, ethyl, propyl, butyl, pentyl, and hexyl) groups, branched $C_1$-$C_6$ alkyl groups, $C_1$-$C_6$ hydroxyalkyl (e.g., hydroxymethyl, hydroxyethyl, hydroxypropyl, hydroxybutyl, hydroxypentyl, and hydroxyhexyl) groups, substituted $C_6$-$C_{10}$ aryl groups, unsubstituted $C_6$-$C_{10}$ aryl groups (e.g., benzyl groups), and any combination thereof, such as tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide.

The amount of pH adjusting agent(s) added is dependent on the desired pH, as disclosed herein and as understood by the person skilled in the art. For example, the pH adjusting agent may be present in an amount of from about 0.1 wt % to about 10 wt %, based on the total weight of the cleaning composition, and, more preferably, in an amount of from about 1 wt % to about 5 wt %. In one embodiment, the pH adjusting agent comprises KOH. In another embodiment, the pH adjusting agent comprises choline hydroxide. In yet another embodiment, the pH adjusting agent comprises ammonium hydroxide. In another embodiment, the pH adjusting agent comprises at least one alkali metal hydroxide and at least one additional hydroxide enumerated herein. In another embodiment, the pH adjusting agent comprises KOH and at least one additional hydroxide enumerated herein. In still another embodiment, the pH adjusting agent comprises KOH and at least one of choline hydroxide and ammonium hydroxide.

The pH of the cleaning composition described herein can vary depending on the target application. In one embodiment, the pH of the composition is greater than 7 and, as such, may be a basic aqueous cleaning composition. For this embodiment, preferably the pH is in a range from about 10 to greater than 14, more preferably in a range from about 12 to about 14, and most preferably in a range from about 13 to 14. It is understood by the person skilled in the art that upon dilution, such as by formation of a concentration described below and subsequent addition of water, the pH of the cleaning composition will decrease to a range of about 10 to about 12.

The cleaning composition described herein comprises at least one oxylamine compound or salt thereof. In particular, the oxylamine compound may be a hydroxylamine or an aminoxyl (nitroxyl) compound. For example, the composition may comprise at least one hydroxylamine compound, at least one aminoxyl compound, or combination thereof. An oxylamine compound may in principle be any compound that includes an oxygen group (such as —O. or —OH) bonded to a nitrogen (N) atom. In some cases, the salt form of the oxylamine compound may more stable or readily available, wherein the compound includes an hydroxylate (—OM) group bonded to the nitrogen atom. Examples include Na+, K+, Li+ or ammonium salts.

In more detail, the oxylamine compound may be a hydroxylamine compound having the general formula (I):

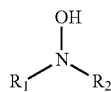

or may be an aminoxyl compound having the general formula (II):

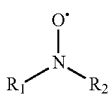

$R_1$ and $R_2$ may be the same as or different from one another and are selected from the group consisting of hydrogen and straight-chain, branched, or cyclic alkyl groups, including $C_1$-$C_8$ alkyl groups (e.g., methyl, ethyl, propyl, butyl, pentyl, hexyl, heptyl, and octyl). As such, the oxylamine compound may be an alkyloxylamine (for example, an alkylhydroxylamine, in particular a dialkylhydroxylamine). Suitably, the oxylamine compound may be symmetrical, with $R_1$ and $R_2$ in formulas (I) and (II) being the same. Illustrative examples of hydroxylamine compounds include, but are not limited to, hydroxylamine ($NH_2OH$), dimethyl hydroxyl amine, methyl ethyl hydroxylamine, methyl propyl hydroxylamine, methyl butyl hydroxylamine, diethylhydroxylamine (DEHA), ethyl propyl hydroxylamine, ethyl butyl hydroxylamine, dipropyl hydroxylamine, propyl butyl hydroxylamine, dibutyl hydroxylamine, di(t-butyl)hydroxylamine, morpholine-N-hydroxide, N-hydroxysuccinamine, N-hydroxymaleimide, or salts thereof. Examples of salts include, but are not limited to, hydroxylamine hydrochloride, hydroxylamine sulfate, or hydroxylamine acetate. Illustrative examples of aminoxyl compounds include, but are not limited to 2,2,6,6-tetramethylpiperidin-1-yl)oxyl (also sometimes referred to as (2,2,6,6-tetramethylpiperidin-1-yl)oxidanyl, or TEMPO), 4-amino-TEMPO, 4-carboxy-TEMPO, 4-phosphonoxy-TEMPO, 4-hydroxy-TEMPO, polymers with covalently bound TEMPO side groups or end groups. Other suitable examples include 2,2,5,5-tetramethylpyrrolidin-1-yl)oxidanyl (also sometimes referred to as 2,2,5,5-tetramethylpyrrolidine-N-oxyl nitroxide or PROXYL), 3-amino-PROXYL, 3-carboxy-PROXYL, 3-phosphonoxy-PROXYL, 3-hydroxy-PROXYL, and polymers with covalently bound PROXYL side groups or end groups.

In some embodiments, the hydroxyl amine may be further functionalized in which, for example, $R_1$ and $R_2$ may be selected from the group consisting of straight-chain or branched $C_1$-$C_8$ alcohol (e.g., methanol, ethanol, propanol, butanol, pentanol, hexanol, heptanol, and octanol), and straight-chain or branched ethers having the formula $R^4$—O—$R^5$, where $R^4$ and $R^5$ may be the same as or different from one another and are selected from the group consisting of $C_1$-$C_8$ alkyls, with either $R^4$ or $R^5$ bonded to N. As a particular example, $R_1$ and/or $R_2$ may comprise a $C_1$-$C_4$ alkyl group.

In various embodiments the composition comprises in the range of from 0.1 to 20% w/w, based on the total weight of the composition, of an oxylamine compound or oxylamine compound component as described anywhere herein. Suitably, the amount of oxylamine compound or oxylamine compound component may be in the range of from 0.01 to 10% w/w, for example in the range of from 0.1 to 7% w/w.

The amount of oxylamine compound or salt thereof in the cleaning composition is in a range from about 0.01 wt % to about 25 wt %, based on the total weight of the cleaning composition. Preferably, the oxylamine compound is present in an amount of from about 0.1 wt % to about 10 wt %, based on the total weight of the cleaning composition, and, more preferably, in an amount of from about 0.5 wt % to about 5 wt %.

The cleaning compositions of the present disclosure may optionally further comprise one or more additional components that may provide further benefit, particularly for cleaning microelectronic devices comprising a cobalt-containing material. In some embodiments, the cleaning compositions may comprise at least one etchant, at least one corrosion inhibitor, and/or at least one reducing agent.

For example, the cleaning composition may optionally comprise at least one etchant. Suitably, the composition may comprise an etchant component consisting of a plurality of additional etchants. Examples of etchants include, but are not limited to, morpholine, diglycolamine, 3-butoxypropylamine, propylene glycol monobutyl ether (e.g., DOWANOL PnB), hydroxyethylmorpholine, hydroxypropylmorpholine, aminoethylmorpholine, aminopropylmorpholine, pentamethyldiethylenetriamine (PMDETA), piperazine, N,N-dimethylpropanolamine, ethanolamine, diethanolamine, diethylamine, ethylenediamine, diethylenetriamine, tetraethylene pentamine, triethylenetetramine, trimethylaminoethylethanolamine, trimethylaminopropylethanolamine, and combinations thereof. In various embodiments, when present, the amount of etchant in the cleaning is in the range of from about 0.1 wt % to about 20 wt % based on the total weight of the cleaning composition. Preferably, the etchant is present in an amount of from about 1 wt % to about 20 wt %, based on the total weight of the composition, and, more preferably in an amount of from about 1 wt % to about 10 wt %. In various embodiments, the cleaning composition does not contain an etchant.

The cleaning composition may optionally comprise at least one corrosion inhibitor. Illustrative corrosion inhibitors include, but are not limited to, acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, oxalic acid, tannic acid, picolinic acid, 1,3-cyclopentanedione, catechol, pyrogallol, resorcinol, hydroquinone, cyanuric acid, barbituric acid, 1,2-dimethylbarbituric acid, pyruvic acid, propanethiol, benzohydroxamic acids, 2,5-dicarboxypryidine, 4-(2-hydroxyethyl)morpholine (HEM), N-aminoethylpiperazine (N-AEP), ethylenediaminetetraacetic acid (EDTA), 1,2-cyclohexanediamine-N,N,N',N'-tetraacetic acid (CDTA), N-(hydroxyethyl)-ethylenediaminetriacetic acid (HEdTA), iminodiacetic acid (IDA), 2-(hydroxyethyl)iminodiacetic acid (HIDA), nitrilotriacetic acid, thiourea, 1,1,3,3-tetramethylurea, urea, urea derivatives, glycine, cysteine, glutamic acid, isoleucine, methionine, piperadine, N-(2-aminoethyl) piperadine, pyrrolidine, threonine, tryptophan, salicylic acid, p-toluenesulfonic acid, salicylhyroxyamic, 5-sulfosalicylic acid, triazole, aminotriazole, dimethylpropargyl alcohol, lauroyl sarcosine, steroyl sarcosine, saccharine, and combinations thereof. In various embodiments, when present, the amount of corrosion inhibitor in the cleaning is in the range of from about 0.01 wt % to about 10 wt % based on the total weight of the cleaning composition. Preferably, the corrosion inhibitor is present in an amount of from about 0.01 wt % to about 5 wt %, based on the total weight of the composition, and, more preferably in an amount of from about 0.05 wt % to about 5 wt %. In various embodiments, the cleaning composition does not contain a corrosion inhibitor.

The cleaning composition may optionally comprise at least one reducing agent. Illustrative reducing agents include, but are not limited to, ascorbic acid, L(+)-ascorbic acid, isoascorbic acid, ascorbic acid derivatives, sulfurous acid, ammonium sulfite, potassium sulfite, sodium sulfite, dopamine HCl, phosphorous acid, phosphinic acid, hypophosphorous acid, potassium metabisulfite, sodium metabisulfite, ammonium metabisulfite, potassium pyruvate, sodium pyruvate, ammonium pyruvate, formic acid, sodium formate, potassium formate, ammonium formate, dopamine, sulfur dioxide solution, and any combination thereof. For example, the at least one reducing agent may comprise at least one sulfite ion and at least one other enumerated reducing agent, for example, sulfurous acid, potassium sulfite, ammonium sulfite, phosphinic acid, and any combination thereof. It is to be appreciated that when ammonium sulfite is present, the ammonium sulfite can be produced in situ, wherein the combination of specific components results in the formation of ammonium sulfite to assist with the removal of residue, e.g., ceria particles and other post-CMP residue. In various embodiments, when present, the amount of reducing agent in the cleaning is in the range of from about 0.0001 wt % to about 1 wt % based on the total weight of the cleaning composition. Preferably, the reducing agent is present in an amount of from about 0.0001 wt % to about 0.2 wt %, based on the total weight of the composition, and, more preferably in an amount of from about 0.01 wt % to about 0.2 wt %. In various embodiments, the cleaning composition does not contain a reducing agent.

The range of weight percent ratios of the components will cover all possible concentrated or diluted embodiments of the composition. Towards that end, in one embodiment, a concentrated removal composition is provided that can be diluted for use as a cleaning solution. A concentrated composition, or "concentrate," advantageously permits a user (e.g. a CMP process engineer) to dilute the concentrate to the desired strength and pH at the point of use. Dilution of the concentrated aqueous removal composition may be in a range from about 1:1 to about 2500:1, preferably about 5:1 to about 200:1, and most preferably about 20:1 to about 120:1, wherein the aqueous removal composition is diluted at or just before the tool with solvent, e.g., deionized water. It is to be appreciated by one skilled in the art that following dilution, the range of weight percent ratios of the components disclosed herein should remain unchanged.

The compositions described herein may have utility in applications including, but not limited to, post-etch residue removal, post-ash residue removal surface preparation, post-plating cleaning and post-CMP residue removal. In addition to cleaning of cobalt-containing components, it is contemplated that the aqueous cleaning compositions described herein may also be useful for the cleaning and protection of other metals (e.g., copper-containing and tungsten-containing) products including, but not limited to, decorative metals, metal wire bonding, printed circuit boards and other electronic packaging using metal or metal alloys.

The aqueous cleaning compositions are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect relates to a kit including, in one or more containers, one or more components adapted to form the cleaning compositions described herein. The kit may include, in one or more containers, at least one complexing agent, at least one cleaning additive, at least one pH adjusting agent, at least one oxylamine compound, water, optionally at least one etchant, optionally at least corrosion inhibitor, and optionally at least one reducing agent, for combining with additional solvent (e.g., water) at the fab or the point of use. Alternatively, the kit may include, in one or more containers, at least one complexing agent, at least one cleaning additive, at least one oxylamine compound, water, optionally at least one etchant, optionally at least corrosion inhibitor, and optionally at least one reducing agent, for combining with at least one pH adjusting agent and additional solvent (e.g., water) at the fab or the point of use. The containers of the kit must be suitable for storing and shipping the compositions and may be, for example, NOWPak® containers (Entegris, Inc., Billerica, Mass., USA).

The one or more containers which contain the components of the aqueous cleaning composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended removal composition to a process tool.

As applied to microelectronic manufacturing operations, the cleaning compositions described herein are usefully employed for removing residue and contaminants, including particles, post-CMP residue, post-ash residue, and post-etch residue, from the surface of the microelectronic device. Advantageously, the disclosed cleaning compositions described herein show improved cobalt compatibility relative to alternative cleaning compositions previously described in the art. Thus, the present disclosure further relates to a method of removing residue and contaminants from a microelectronic device having said residue and contaminants thereon using the cleaning compositions described herein.

The method comprises contacting a microelectronic device with the disclosed cleaning composition for a time sufficient to at least partially clean the residue and contaminants from the microelectronic device, In use, the cleaning composition is typically contacted with the device for a time of from about 5 sec to about 10 minutes, preferably about 1 sec to 20 min, preferably about 15 sec to about 5 min at temperature in a range of from about 20° C. to about 90° C., preferably about 20° C. to about 50° C. Such contacting times and temperatures are illustrative, and any other suitable time and temperature conditions may be employed that are efficacious to at least partially remove the residue and contaminants from the device, within the broad practice of the method. "At least partially clean" and "substantial removal" both correspond to at removal of at least 85% of the ceria particles present on the device prior to particle removal, more preferably at least 90%, even more preferably at least 95%, and most preferred at least 99%.

After contacting the device and removing the target desired residues and/or contaminants, the cleaning composition may be readily removed from the device to which it has previously been applied, as may be desired and efficacious in a given end use application of the compositions described herein. For example, preferably a rinse solution may be used, wherein the rinse solution includes deionized water. Thereafter, the device may be dried using nitrogen or a spin-dry cycle, as is known in the art.

Yet another aspect of the present disclosure relates to the improved microelectronic devices made according to the methods described herein and to products containing such microelectronic devices. Another aspect relates to a recycled cleaning composition, wherein the composition may be recycled until particle and/or contaminant loading reaches the maximum amount the aqueous removal composition may accommodate, as readily determined by one skilled in the art. As such, the cleaning composition disclosed herein may include residue and/or contaminants. The residue and contaminants may be dissolved in the composition. Alternatively, the residue and contaminants may be suspended in the composition. Preferably, the residue includes post-CMP residue, post-etch residue, post-ash residue, contaminants, or combinations thereof. A still further aspect relates to methods of manufacturing an article comprising a microelectronic device, said method comprising contacting the microelectronic device with the present cleaning composition for a time sufficient to remove residue and/or contaminants from the microelectronic device and incorporating the cleaned microelectronic device into an article. Another aspect relates to the article produced by this method.

EXAMPLES

The features and advantages of the cleaning compositions of the present disclosure are more fully illustrated by the following non-limiting examples, wherein all parts and percentages are by weight, unless otherwise expressly stated. Cleaning composition are disclosed that are particularly useful for cleaning residue and contaminants, e.g., post-CMP residue, post-etch residue, post-ash residue, and contaminants from a microelectronic device structure while still being compatible with cobalt-containing materials present on the surface.

Example 1

The following examples demonstrate the effectiveness of adding at least one hydroxylamine to a cleaning composition.

Two compositions were prepared and are shown in Table 1 below. All numbers in the table refer to wt % based on the total composition, and any failure to total 100% is only due to rounding.

TABLE 1

| ID | DI Water | 46.7% aq choline hydroxide | MEA | cysteine | DEHA | L-Tartaric Acid | Co ER (A/min) | Co ER Std. Dev. |
|---|---|---|---|---|---|---|---|---|
| Comp Ex 1 | 80.5 | 18.2 | 1.1 | 0.05 | 0 | 0.095 | 0.6 | 0.02 |
| Example 1 | 75.6 | 18.2 | 1.1 | 0.05 | 4.9 | 0.095 | 0.4 | 0.05 |

As shown, the only difference between the compositions of Comp Ex 1 and Example 1 is the replacement of an amount of water with DEHA. Comp Ex 1 is a comparative example not in accordance with the present disclosure.

Each composition was diluted with deionized water at a ratio of 60:1 water to composition, and a coupon of cobalt was then exposed to each diluted composition for 15 minutes at a temperature of 30° C. The extent of etching of the cobalt coupons was determined and shown in Table 1. As can be seen, the cleaning composition of Comp Ex 1 showed an etch rate of 0.6 A/min with a standard deviation of 0.02. By comparison, the composition of Example 1 showed an etch rate of 0.4 A/min with a standard deviation of 0.05. These results show that inclusion of an hydroxylamine such as DEHA is effective in reducing cobalt etching.

Examples 2-3

The following examples demonstrates cleaning compositions of the present disclosure comprising at least one hydroxylamine and having high cobalt compatibility.

Compositions of the present disclosure, comprising at least one complexing agent, at least one cleaning additive, at least one pH adjusting agent, and at least one hydroxyl amine were prepared. The composition were as follows:
Example 2: 18.2% choline hydroxide (added as a 46.7% aqueous solution), 1.13% MEA, 0.05% cysteine, 4.9% DEHA, and 75.625% DI water. The pH of the composition was 13.5.
Example 3: 2.09% KOH (added as a 45% aqueous solution), 1.25% MEA, 0.1% cysteine, 0.8% HEDP (added as a 60% aqueous solution), 5.3% morpholine, 1% 1-butoxy-2-propanol, 3% DMSO, 0.9% DEHA, and 85.56% DI water.
All numbers refer to wt % based on the total composition, and any failure to total 100% is only due to rounding.

Each composition was diluted with deionized water at a ratio of 60:1 water to composition. A coupon of cobalt was then exposed to each diluted composition for 15 minutes at a temperature of 30° C., and the extent of etching of the cobalt coupons was determined. It was found that the compositions of both Example 2 and Example 3, containing DEHA as the hydroxylamine, had improved cobalt compatibility based on their reduced cobalt etch rates Examples 4-13

The following examples demonstrates the effectiveness of various cleaning compositions of the present disclosure comprising at least one hydroxylamine for removal of a silica slurry from a cobalt substrate.

Compositions of the present disclosure, comprising at least one complexing agent, at least one cleaning additive, at least one pH adjusting agent, and at least one hydroxyl amine were prepared and are shown in Table 2 below. All numbers in the table refer to wt % based on the total composition, and any failure to total 100% is only due to rounding.

The compositions shown were prepared and diluted 100:1 with water. Cobalt coupons were immersed in a silica-containing slurry for 5 minutes, rinses in DI water for 30 seconds, and then immersed in the cleaning composition for 60 seconds, followed by rinsing with a second DI water rinse for 30 seconds. The temperature during immersion was room temperature. The extent of cleaning was determined using Scanning Electron Microscopy (SEM), and the results are shown in Table 3 below.

TABLE 2

| Ex | DI Water | 45% KOH | MEA | cysteine | morpholine | HEDP | DEHA | DMSO | 1-butoxy-2-propanol | Sulfurous acid |
|---|---|---|---|---|---|---|---|---|---|---|
| 4 | 83.01 | 4.64 | 1.25 | 0.1 | 5.3 | 0.8 | 0.9 | 3 | 1 | 0 |
| 5 | 78.31 | 4.64 | 4.95 | 0.2 | 5.3 | 0.8 | 1.8 | 3 | 1 | 0 |
| 6 | 83.46 | 4.64 | 0 | 0 | 5.3 | 0.8 | 1.8 | 3 | 1 | 0 |
| 7 | 78.51 | 4.64 | 4.95 | 0 | 5.3 | 0.8 | 1.8 | 3 | 1 | 0 |
| 8 | 83.26 | 4.64 | 0 | 0.2 | 5.3 | 0.8 | 1.8 | 3 | 1 | 0 |
| 9 | 85.75 | 1.9 | 1.25 | 0.1 | 5.3 | 0.8 | 0.9 | 3 | 1 | 0 |
| 10 | 85.75 | 1.9 | 1.25 | 0.1 | 5.3 | 0.8 | 0.9 | 3 | 1 | 0.1 |
| 11 | 85.75 | 1.9 | 1.25 | 0.1 | 5.3 | 0.8 | 0.9 | 3 | 1 | 0.4 |
| 12 | 86.15 | 1.9 | 1.25 | 0.1 | 5.3 | 0.4 | 0.9 | 3 | 1 | 0.1 |
| 13 | 86.15 | 1.9 | 1.25 | 0.1 | 5.3 | 0.4 | 0.9 | 3 | 1 | 0.4 |

TABLE 3

| Example | Silica Particle Area (SEM) |
|---|---|
| 2 | 3308 |
| 3 | 2737 |
| 4 | 2789 |
| 5 | 4540 |
| 6 | 4508 |
| 7 | 3008 |
| 8 | 5490 |
| 9 | 3137 |
| 10 | 6950 |
| 11 | 5470 |

As shown, each of the cleaning composition, containing diethylhydroxylamine, were able to effectively remove silica slurry particles from the cobalt-containing substrate. Thus, compositions containing hydroxylamines can remove residue particles from a cobalt substrate while maintaining effective cobalt compatibility (as shown by the reduced etch rates in Example 1-3).

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A cleaning composition for cleaning residue and contaminants from microelectronic devices having same thereon, the cleaning composition comprising from about 0.1 wt % to about 10 wt % of at least one complexing agent, wherein the complexing agent is monoethanolamine (MEA), cysteine and 1-hydroxyethylidene-1,1-diphosphonic acid (HEDP), from about 0.1 wt % to about 10 wt % of at least one cleaning additive, from about 1 wt % to about 5 wt % of at least one pH adjusting agent, water, and from about 0.1 wt % to about 10 wt % of at least one alkyloxylamine compound or salt thereof,
   wherein the composition is an aqueous cleaning composition having a pH of from about 10 to about 14 and comprising at least 50% by weight water, and
   wherein the cleaning additive comprises a species selected from the group consisting of 2-pyrrolidinone, 1-(2-hydroxyethyl)-2-pyrrolidinone (HEP), glycerol, tetramethylene sulfone (sulfolane), dimethyl sulfone, tetraglyme, diglyme, methyl isobutyl ketone, methyl ethyl ketone, isopropanol, octanol, ethanol, butanol, methanol, isophorone, 4-methyl-2-pentanone, 2,4-dimethyl-3-pentanone, 5-methyl-3-heptanone, 3-pentanone, 5-hydroxy-2-pentanone, 2,5-hexanedione, 4-hydroxy-4-methyl-2-pentanone, 2-methyl-2-butanone, 3,3-dimethyl-2-butanone, 4-hydroxy-2-butanone, cyclopentanone, 2-pentanone, 3-pentanone, 1-phenylethanone, acetophenone, benzophenone, 2-hexanone, 3-hexanone, 2-heptanone, 3-heptanone, 4-heptanone, 2,6-dimethyl-4-heptanone, 2-octanone, 3-octanone, 4-octanone, dicyclohexyl ketone, 2,6-dimethylcyclohexanone, 2-acetylcyclohexanone, 2,4-pentanedione, menthone, dimethylsulfoxide (DMSO), dimethylformamide (DMF), N-methyl pyrrolidone, N-ethyl pyrrolidone, hydroxypropylcellulose, hydroxyethylcellulose, carboxymethylcellulose, sodium carboxymethylcellulose (NaCMC), sodium dodecylsulfate (SDS), ammonium dodecylsulfate, potassium dodecylsulfate, ammonium carboxymethylcellulose, potassium carboxymethylcellulose, polyvinylpyrrolidone (PVP), polyaminoacids, polyamidohydroxyurethanes, polylactones, polyacrylamide, Xanthan gum, chitosan, polyvinyl alcohol, polyvinyl acetate, polyacrylic acid, polyethyleneimine, sorbitol ester, xylitol, esters of anhydrosorbitols, secondary alcohol ethoxylates, potassium alginate, ammonium alginate, calcium alginate, poly(ethylene glycol methacrylate), and combinations thereof.

2. The cleaning composition of claim 1, wherein the cleaning composition comprises from about 0.1 wt % to about 5 wt % of the complexing agent.

3. The cleaning composition of claim 1, wherein the cleaning composition comprises from about 0.5 wt % to about 5 wt % of the cleaning additive.

4. The cleaning composition of claim 1, wherein the pH adjusting agent comprises a species selected from the group consisting of alkali metal hydroxide, alkaline earth metal hydroxides, ammonium hydroxide, tetramethylammonium hydroxide (TMAH), tetraethylammonium hydroxide (TEAH), tetrapropylammonium hydroxide (TPAH), tetrabutylammonium hydroxide (TB AH), tributylmethylammonium hydroxide (TBMAH), benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide, and combinations thereof.

5. The cleaning composition of claim 1, wherein the cleaning composition has a pH of from about 12 to about 14.

6. The cleaning composition of claim 1, wherein the cleaning composition an aqueous cleaning composition comprising at least about 80 wt % water.

7. The cleaning composition of claim 1, wherein the cleaning composition comprises from about 0.01 wt % to about 7 wt % of the alkyloxylamine compound or salt thereof.

8. The cleaning composition of claim 1, wherein the cleaning composition further comprises at least one etchant, wherein the etchant comprises a species selected from the group consisting of morpholine, diglycolamine, 3-butoxypropylamine, propylene glycol monobutyl ether, hydroxyethylmorpholine, hydroxypropylmorpholine, aminoethylmorpholine, aminopropylmorpholine, pentamethyldiethylenetriamine (PMDETA), piperazine, N,N-dimethylpropanolamine, ethanolamine, diethanolamine, diethylamine, ethylenediamine, diethylenetriamine, tetraethylene pentamine, triethylenetetramine, trimethylaminoethylethanolamine, trimethylaminopropylethanolamine, and combinations thereof.

9. The cleaning composition of claim 1, wherein the cleaning composition further comprises at least one corrosion inhibitor, wherein the corrosion inhibitor comprises a species selected from the group consisting of acetic acid, acetone oxime, acrylic acid, adipic acid, alanine, arginine, asparagine, aspartic acid, betaine, dimethyl glyoxime, formic acid, fumaric acid, gluconic acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, tartaric acid, terephthalic acid, trimellitic acid, trimesic acid, tyrosine, valine, xylitol, oxalic acid, tannic acid, picolinic acid, 1,3-cyclopentanedione, catechol, pyrogallol, resorcinol, hydroquinone, cyanuric acid, barbituric acid, 1,2-dimethylbarbituric acid, pyruvic acid, propanethiol, benzohydroxamic acids, 2,5-dicarboxypryidine, 4-(2-hydroxyethyl) morpholine (HEM), N-aminoethylpiperazine (N-AEP), ethylenediaminetetraacetic acid (EDTA), 1,2-cyclohexanediamine-N,N,N',N'-tetraacetic acid (CDTA), N-(hydroxyethyl)-ethylenediaminetriacetic acid (HEdTA), iminodiacetic acid (IDA), 2-(hydroxyethyl)iminodiacetic acid (HIDA), nitrilotriacetic acid, thiourea, 1,1,3,3-tetramethylurea, urea, urea derivatives, glycine, cysteine, glutamic acid, isoleucine, methionine, piperadine, N-(2-aminoethyl) piperadine, pyrrolidine, threonine, tryptophan, salicylic acid, p-toluenesulfonic acid, salicylhyroxyamic, 5-sulfosalicylic acid, triazole, aminotriazole, dimethylpropargyl alcohol, lauroyl sarcosine, steroyl sarcosine, saccharine, and combinations thereof.

10. The cleaning composition of claim 1, wherein the cleaning composition further comprises at least one reducing agent, wherein the reducing agent comprises a species selected from the group consisting of ascorbic acid, L(+)-ascorbic acid, isoascorbic acid, ascorbic acid derivatives, sulfurous acid, ammonium sulfite, potassium sulfite, sodium sulfite, dopamine HCl, phosphorous acid, phosphinic acid, potassium metabisulfite, sodium metabisulfite, ammonium metabisulfite, hydroxylamine, potassium pyruvate, sodium pyruvate, ammonium pyruvate, formic acid, sodium formate, potassium formate, ammonium formate, dopamine, sulfur dioxide solution, and combination thereof.

11. The cleaning composition of claim 1, wherein the cleaning composition is substantially devoid of fluoride-containing sources, abrasive materials, and tetramethylammonium hydroxide.

12. The cleaning composition of claim 1, wherein the cleaning composition has a pH in a range of from about 13 to about 14.

13. The cleaning composition of claim 1, wherein the cleaning composition further comprises residue and contaminants, wherein the residue comprises post-CMP residue, post-etch residue, post-ash residue, or combinations thereof.

14. The cleaning composition of claim 1, wherein the alkyloxylamine compound comprises an alkylhydroxylamine compound having the formula:

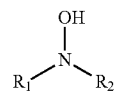

or salts thereof, wherein $R_1$ and $R_2$ may be the same as or different from one another and is a straight-chain, cyclic, or branched alkyl group.

15. The cleaning composition of claim 14, wherein the alkylhydroxylamine compound comprises N,N-diethylhydroxylamine or salts thereof.

16. A method of removing residue and contaminants from a microelectronic device having the residue and contaminants thereon, the method comprising contacting the microelectronic device with a cleaning composition of claim 1 for a time sufficient to at least partially clean the residue and contaminants from the microelectronic device.

17. The method of claim 16, wherein the microelectronic device comprises a cobalt-containing material, and wherein the cleaning composition contacts the cobalt-containing material.

* * * * *